United States Patent
Jerez et al.

(10) Patent No.: US 9,006,689 B2
(45) Date of Patent: Apr. 14, 2015

(54) SOURCE BUSHING SHIELDING

(71) Applicants: Manuel A. Jerez, Roosevelt, NY (US); Carlos F. M. Borges, Roslyn Estates, NY (US); Charles W. Lisa, Coram, NY (US); Alejandro M. Centeno, Mineola, NY (US)

(72) Inventors: Manuel A. Jerez, Roosevelt, NY (US); Carlos F. M. Borges, Roslyn Estates, NY (US); Charles W. Lisa, Coram, NY (US); Alejandro M. Centeno, Mineola, NY (US)

(73) Assignee: ion Technology Solutions, LLC, Mineola, NY (US)

( * ) Notice: Subject to any disclaimer, the term of this patent is extended or adjusted under 35 U.S.C. 154(b) by 12 days.

(21) Appl. No.: 13/850,557

(22) Filed: Mar. 26, 2013

(65) Prior Publication Data

US 2014/0291554 A1    Oct. 2, 2014

(51) Int. Cl.
| | | |
|---|---|---|
| *G21K 1/00* | (2006.01) | |
| *H01J 37/317* | (2006.01) | |
| *H01J 37/248* | (2006.01) | |
| *H05G 1/04* | (2006.01) | |

(52) U.S. Cl.
CPC ............... *G21K 1/00* (2013.01); *H01J 37/3171* (2013.01); *H05G 1/04* (2013.01); *H01J 37/248* (2013.01); *H01J 2237/0206* (2013.01); *H01J 2237/022* (2013.01); *H01J 2237/0266* (2013.01); *H01J 2237/032* (2013.01); *H01J 2237/038* (2013.01); *H01J 2237/08* (2013.01)

(58) Field of Classification Search
CPC . H01J 37/08; H01J 37/3171; H01J 2237/038; H01J 2237/166; H05G 1/04
USPC .......................................... 250/492.21, 492.3
See application file for complete search history.

(56) References Cited

U.S. PATENT DOCUMENTS

| | | | | |
|---|---|---|---|---|
| 4,613,167 | A * | 9/1986 | Okahashi et al. | 285/54 |
| 5,276,286 | A * | 1/1994 | Demissy et al. | 218/10 |
| 5,420,415 | A * | 5/1995 | Trueira | 250/492.21 |
| 5,583,472 | A * | 12/1996 | Moritsu et al. | 335/216 |
| 6,583,544 | B1 * | 6/2003 | Horsky et al. | 313/359.1 |
| 6,683,317 | B1 * | 1/2004 | Simmons et al. | 250/492.21 |
| 6,768,121 | B2 * | 7/2004 | Horsky et al. | 250/427 |
| 6,897,457 | B1 * | 5/2005 | Holmes et al. | 250/492.21 |
| 7,569,837 | B2 * | 8/2009 | Shigehiro et al. | 250/423 R |
| 8,044,374 | B2 * | 10/2011 | Ryding et al. | 250/492.21 |
| 8,253,334 | B2 * | 8/2012 | Jerez | 313/613 |
| 8,263,952 | B1 * | 9/2012 | McCord | 250/492.21 |
| 2002/0084426 | A1 * | 7/2002 | Gerlach et al. | 250/492.1 |
| 2002/0158213 | A1 * | 10/2002 | Matsunaga et al. | 250/492.21 |
| 2003/0168168 | A1 * | 9/2003 | Liu et al. | 156/345.3 |
| 2004/0000651 | A1 * | 1/2004 | Horsky et al. | 250/492.21 |
| 2004/0038504 | A1 * | 2/2004 | Ito | 438/520 |
| 2004/0038505 | A1 * | 2/2004 | Ito et al. | 438/520 |
| 2004/0090185 | A1 * | 5/2004 | Ito et al. | 315/111.91 |
| 2007/0210331 | A1 * | 9/2007 | Chen | 257/186 |
| 2009/0039295 | A1 * | 2/2009 | Yu et al. | 250/515.1 |
| 2010/0108915 | A1 * | 5/2010 | Becker et al. | 250/492.3 |
| 2012/0104273 | A1 * | 5/2012 | Ryding et al. | 250/424 |
| 2013/0140977 | A1 * | 6/2013 | Watanabe et al. | 313/460 |

* cited by examiner

*Primary Examiner* — Phillip A Johnston
*Assistant Examiner* — Sean Luck
(74) *Attorney, Agent, or Firm* — Francis C. Hand; Carella, Byrne, et al.

(57) ABSTRACT

The source bushing assembly has a source bushing having an internal vacuum side and an external atmosphere side, a first shield of annular shape disposed at one end of the source bushing in spaced concentric relation to reduce formation of an electrically conductive coating on the source bushing, a second shield of annular shape disposed at an opposite end of the source bushing in spaced concentric relation to prevent arcing on the source bushing and an internally disposed concentric X-ray shield.

10 Claims, 5 Drawing Sheets

SOURCE BUSHING SHIELDING

This invention relates to a source bushing shielding. More particularly, this invention relates to a source bushing shielding in an ion implanter.

In the manufacture of semi-conductors, ion implanters are widely used to diffuse or implant positive ions onto regions of the semi-conductor wafer. Generally, these ion implanters employ an ion source to generate the ion beam used to implant the semi-conductor wafers.

In various instruments which have vacuum enclosures, such as ion implanters, there can be a need to maintain different parts of the enclosure at different operational electrical potentials. For example, the ion source is generally held at a substantial positive potential of more than 10 kV relative to downstream parts of the implanter, such as a mass analyzer magnet and a process chamber in which silicon wafers are implanted.

Typically, the ion source of an ion implanter is biased at a voltage significantly higher than the surrounding components, such as 80 kV, and is electrically insulated from the other components of an on implanter by a "source bushing".

As is known, source bushings may be made of materials having an extremely higher resistivity, such as a ceramic material described in U.S. Pat. No. 6,683,317 having a resistance of greater than 50 GΩ (gigaohms) or a modified material as described in U.S. Pat. No. 8,227,772 having a bulk resistance of less than 4 GΩ gigaohms). Such bushings may also be made of a polymeric material loaded with litharge (also called lead monoxide). The presence of litharge in the insulating material is to screen out x-rays which may be produced within the ion source extraction arrangement by impact of high energy electrons on the various components of the ion implanter.

As described in U.S. Pat. No. 8,227,772, ion sources are typically constructed of tungsten and where a dopant gas containing fluorine is used in the ionization process, tungsten hexafluoride is generated as a gaseous compound that can permeate the region in communication with the ion source. Consequently, a drawback with a conventional ion implanter utilizing fluorine containing dopant gases is that conductive tungsten films may form on the source bushing growing from one end of the source bushing towards the other end. After a short time, this can lead to an electrical breakdown across the uncoated end of the source bushing. In addition, arcing can occur leading to a need to replace the source bushing and downtime of the ion implanter.

Accordingly, it is an object of this invention to operate an ion source in a production facility for extended periods of time without the need for maintenance or repair.

It is another object of the invention to provide an improved source bushing for an ion implanter.

It is an object of the invention to improve ion implanter lifetime and reduce ion implanter downtime.

Briefly, the invention provides a source bushing shielding for an ion source that is constructed to improve the life performance of an ion implanter by reducing the rate at which the bushing is coated with electrically conductive material during ion beam operation.

In accordance with the invention, an ion implanting apparatus comprises an ion source operable at a first electrical potential; a second component operable at a second electrical potential; and a source bushing assembly coupling the ion source and the second component.

The source bushing assembly has an annular source bushing with an internal vacuum side and an external atmosphere side, a first shield of annular shape disposed at one end of the source bushing and spaced in a concentric relationship to the internal vacuum side to slow formation of an electrically conductive coating thereon, a second shield of annular shape disposed at an opposite end of the source bushing spaced in a concentric relation to the internal vacuum side to prevent coating of the source bushing and an internally disposed concentric X-ray shield.

In accordance with the invention, the source bushing assembly has a source flange secured to one end of the source bushing with the first shield mounted on the source flange and a source liner secured to at an opposite end of the source bushing from the source flange with the second shield mounted on the source liner.

With this construction, the lifetime of the source bushing is substantially improved since a shielding surface retains all conductive film generated from fluorine containing gases (BF3, SiF4 and GeF4) reacted with tungsten material, and protects the source bushing from selective chemical attacks.

A water travel channel is formed within the source bushing for a flow of coolant therethrough in order to cool the metallic shields and the source bushing. In accordance with the invention, the water flow pressure is increased in order to improve cooling of the shields and the source bushing.

The source bushing is also provided with a modified grooved source to improve material trap.

These and other objects and advantages of the invention will become more apparent taken in conjunction with the accompanying drawings wherein.

Figure 1:
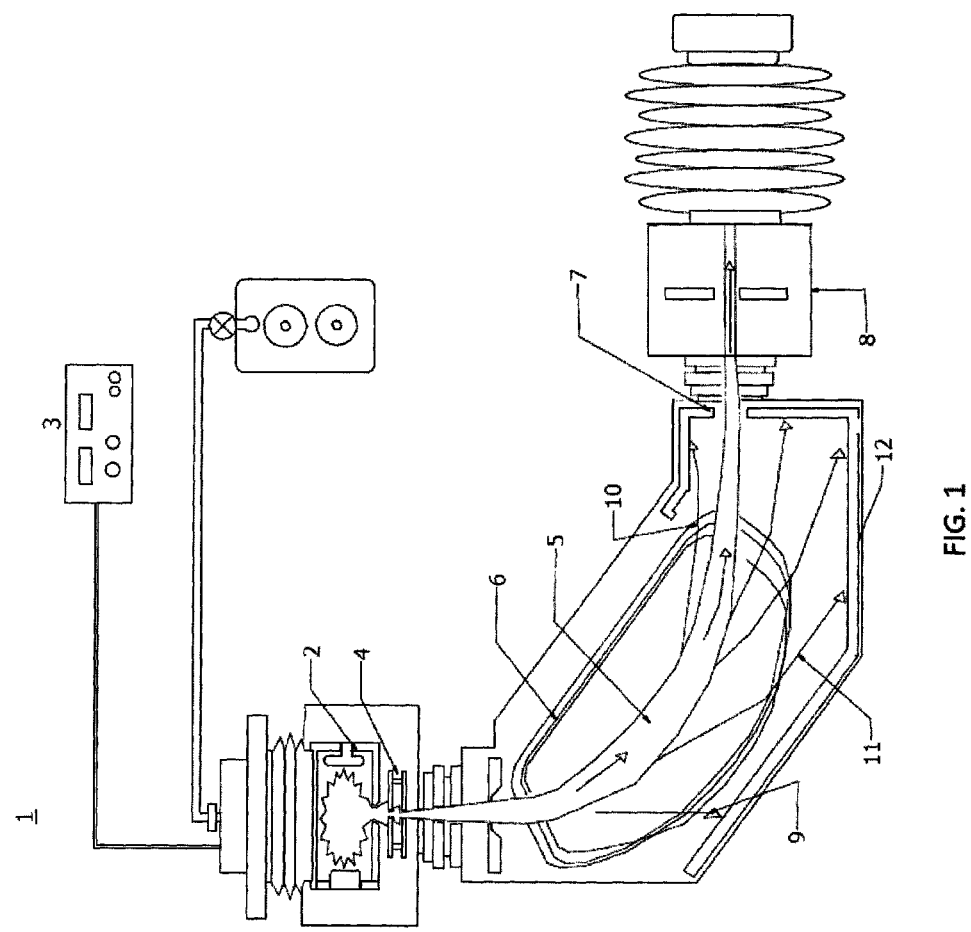
FIG. 1 illustrates a schematic view of ion implanter system.

Referring to FIG. 1, the ion beam implanter 1 includes an ion source 2 for creating ions that form an ion beam 5 which is shaped and selectively deflected to traverse a beam path to an end or implantation station.

The ion source 2 includes a plasma chamber defining an interior region into which source materials are injected. The source materials may include an ionizable gas or vaporized source material. Ions generated within the plasma chamber are extracted from the chamber by ion beam extraction assembly 4 which includes a number of metallic electrodes for creating an ion accelerating electric field.

Subsequent to the beam extraction 4, the beam 5 passes through a mass analyzer 6. The mass analyzer 6 is configured with a particular magnetic field such that only the ions with a desired mass-to-charge ratio are able to travel through the analyzer for maximum transmission through a mass resolving slit 7. Ions of the desired species pass from the mass slit 7 through a deceleration stage 8. The neutral 9, lighter 10 and heavy 11 ions will be stopped on graphite 12 walls inside of the mass analyzer.

Figure 2:
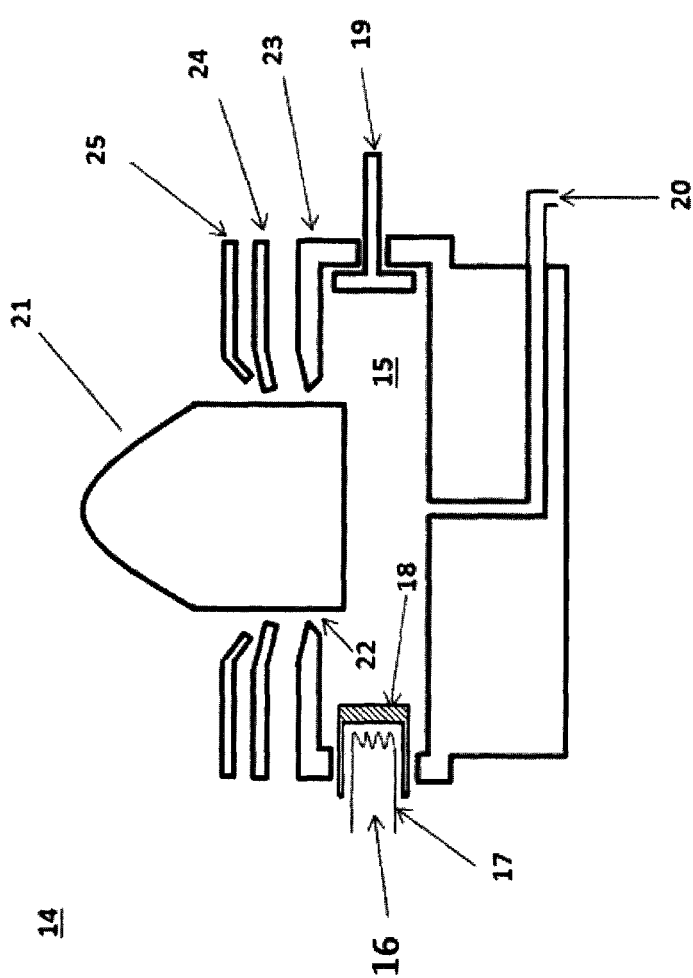
FIG. 2 illustrates a schematic view of ion source and extraction electrode.

Referring to FIG. 2, an indirectly heated cathode (IHC) ion source 14 is typically used as the ion source chamber in high current applications and includes an arc chamber 15 defined by electrically conductive (e.g. tungsten) chamber walls. The chamber 15 defines an ionization zone within which energy is imparted to a dopant feed gas to generate associated ions. Different feed gases are supplied to the ion source chamber 14 to obtain plasma used to form ion beams having particular dopant characteristics. For example the introduction of H2, BF3, GeF4, PH3, and AsH3 as the dopant gas at relatively high chamber temperatures are broken down into mono-atoms having low, medium and high implant energies. These ions are formed into a beam, which then passes through a source filter. The source filter is preferably located near the ion source. The ions within the beam are accelerated/decelerated in column to the desired energy level. A mass analyzer magnet having an aperture is used to remove unwanted components from the ion beam, resulting in an ion beam having the desired energy and mass characteristics passing through resolving aperture.

The IHC ion source chamber 15 includes a cathode/filament assembly 16 located at one end of the arc chamber 15. A filament 17 is positioned in close proximity to a cathode 18 outside the arc chamber 15. A voltage is supplied to filament 17 which produces enough current through the filament 17 to heat the filament 17 and cause thermionic emission of electrons. A cathode 18 is indirectly heated via the filament 17 by biasing the cathode 18 more positively than the filament 17 which causes these thermo-electrons to accelerate from the filament 17 toward the cathode 18, thereby heating the cathode 18. A repeller 19 is typically positioned on the opposite end of the arc chamber 15 and is biased to the same voltage as the cathode 18. The emitted electrons are confined between the cathode 18 and repeller 19 which collide with the dopant feed gas introduced into the chamber via a conduit 20 to generate plasma having the desired properties.

The ions 21 formed from the dopant gas are extracted from the source chamber 15 via an aperture 20 by way of, for example, a standard three (3) electrode configuration comprising a plasma electrode 23, a suppression electrode 24 and a ground electrode 25 used to create an electric field. Although the suppression electrode 24 is shown as being spaced apart from ground electrode 25, this is for illustrative purposes only and the electrodes are physically in contact with each other via insulators. The plasma electrode 23 may be biased at the same large potential as the ion source chamber 15. The suppression electrode 24 is connected to a power supply and is typically biased at a moderate negative value to prevent electrons from entering back into the source chamber 15. The ground electrode 25 is positioned downstream from the suppression electrode 24 and is at a ground potential. The strength of the electric field generated by the electrodes can be tuned to a desired beam current to extract an ion beam from the ions 21 generated in the chamber 15.

A source bushing assembly 13 is coupled between the ion source 2 and other components of the ion implanter such as the vacuum vessel. The two termini of the bushing assembly 13 are maintained at different electrical potentials. The ion source 2 may be energized to a high extraction potential around 80 kV in some instances and even higher in other instances by an extraction power supply 3. The other terminus of the source bushing assembly 13 may be coupled to a component at ground potential.

Advantageously, the source bushing assembly 13 is configured with a shielding of aluminum, tantalum and/or tungsten to trap the metallic material (electrically conductive film), such as a tungsten film, on the source bushing 13 to avoid electrical breakdown of the source bushing.

Figure 3:
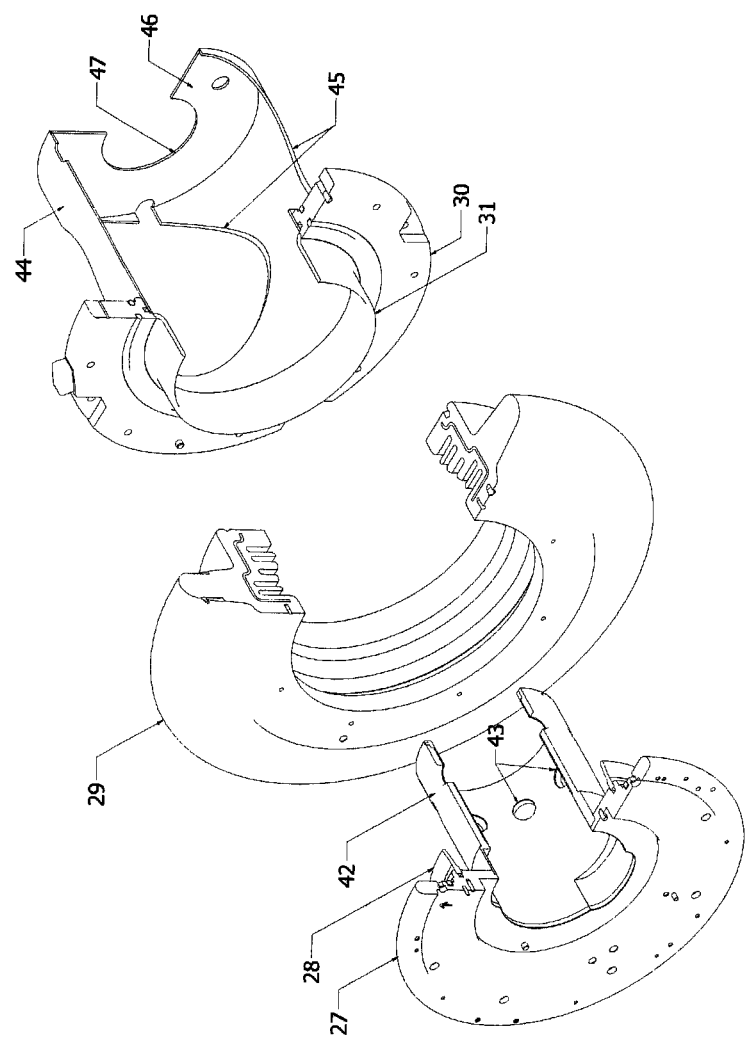
FIG. 3 illustrates an exploded view of a source bushing assembly in accordance with the invention.

As indicated in FIG. 3, the source bushing assembly includes a source bushing 29 of annular shape having an internal vacuum side and an external atmosphere side; a source flange 27 secured to the source bushing 29 at one end; a metallic shield 28 of annular shape mounted on the source flange 27 and disposed in spaced concentric relation to the internal vacuum side of the source bushing 29 to slow the rate of formation of an electrically conductive coating on the source bushing 29; a source liner 30 secured to the source bushing 29 at an opposite end from the source flange 29 and a metallic shield 31 of annular shape mounted on the source liner 30 and disposed in spaced concentric relation to the internal vacuum side of the source bushing 29 to prevent coating of the source bushing 29.

Typically, the source bushing 29 is made using materials having extremely higher resistivity, such as epoxy resin with a ceramic filler. Such a material may have a resistance of greater than 50 GΩ (Giga Ohms) between the ion source and the ground attached components. Also, it is preferred that the material of the bushing 29 be an epoxy resin mixed with lead oxide or barium bismuth. In such a case, when X-rays are generated inside the insulating bushing 29, leakage of the X-rays from the insulating bushing 29 can be prevented.

As illustrated, the two shields 28, 31 are longitudinally spaced from each other.

The source flange shield 28 will prevent sputtered material from depositing directly on the electrical insulator source bushing 29 and will collect the sputtered material while slowing the rate at which the sputtered material forms a coating on the bushing 29.

Figure 4:
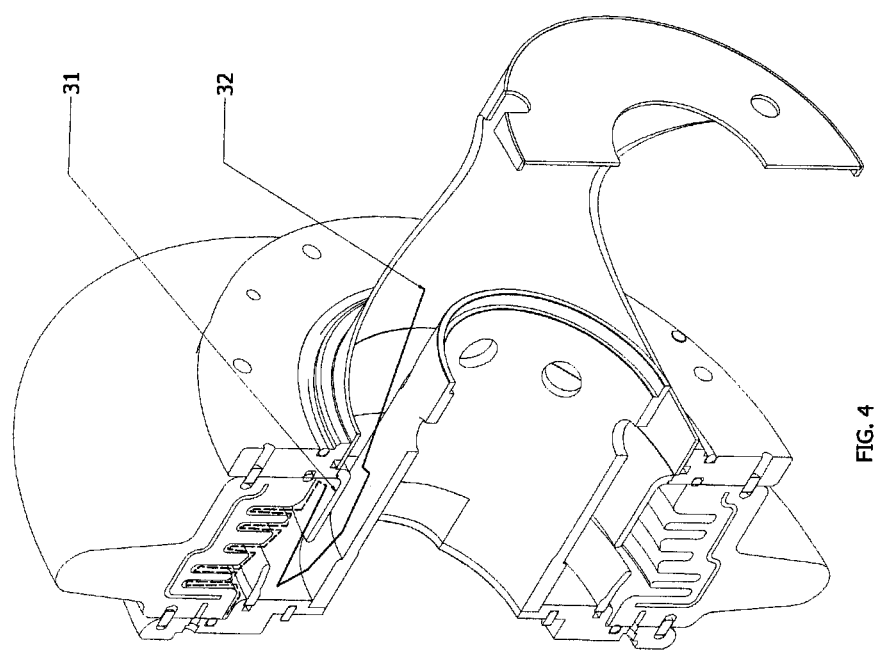
FIG. 4 illustrates a perspective view of the source bushing assembly of FIG. 3.

Referring to FIG. 4, the source liner shield 31 provides a long path for any impurities (vapor) 32 emitted from the ion source of the ion beam generation unit and passing toward the insulating bushing 29. In addition, the impurities 32 adhere to the metallic shield 31. Therefore, with the impurities adhering to the metallic shield 31 and being accumulated thereon, the shield 31 will avoid an arc on the bushing 29. Also, it is not necessary to replace the entire insulating bushing 29 during a periodic maintenance other than to clean the bushing 29 as only the protective metallic shield 31 need be replaced or cleaned.

Figure 5:
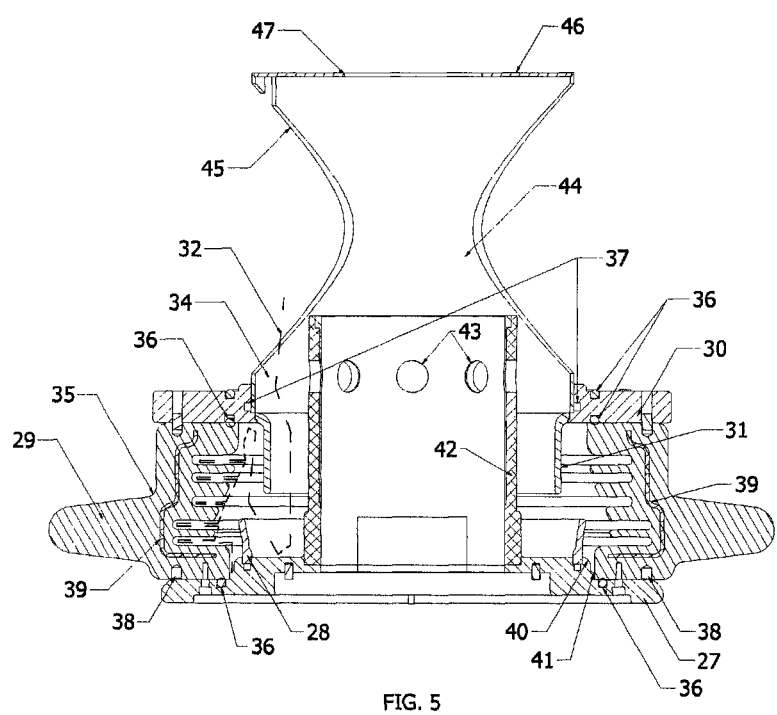
FIG. 5 illustrates a cross-sectional view of the source bushing assembly of FIG. 3.

Referring to FIG. 5, the source bushing 29 has a vacuum side 34 and an atmosphere side 35 and employs vacuum seal O-rings 36 to keep the inside pressure at the level of $1 \times 10^{-5}$ Torr.

The source bushing 29 has a plurality of radially disposed internal ribs, i.e. five ribs as shown rather than the conventional four ribs, in order to improve material trap. The dotted lines indicate the trajectory of the impurities 32 sputtered from the ion source.

As illustrated, a plurality of guide pins 38 are disposed in and between the source bushing 29 and the source flange 27 for aligning the source bushing 29 and the source flange 27 relative to each other during assembly and to make more precise alignment and centering on the source bushing 29. The source bushing 29 can be installed easily.

In addition, the source bushing 29 and the source flange 27 define a circumferential gap 40 that allows an easy installation of the flange 27 on the bushing 29 and minimizes damage on the edges 41 of the source bushing 29.

A water travel channel 37 is formed within the source liner 30 for a flow of coolant therethrough in order to cool the metallic shields 28, 31 and the source bushing 29. The water supplied to the channel may be at a water flow rate of 30 gallons per hour rather than a conventional 15 gallons per hour to obtain an increase in the cooling of the shields 28, 31 and source bushing 29.

The source bushing 29 is constructed using an internal casted X-ray shield 39 with a High Specific Gravity compound (iTS Green X-Ray Shield™). This shield material provides many advantages over lead beyond compliance with environmental regulations. The transition from machined and stamped lead to injection molded engineering resins may help enable tighter tolerance specifications and greater part consistency, enhancing the performance and safety of the x-ray shield 39 for the ion source bushing 29. Avoiding secondary operations required with lead, plus combining multiple components in one part, reduces total manufacturing time, system cost, and complexity. Part-to-part consistency is made possible by injection molding and facilitates uniform shielding, and gives designers precise control over the amount of radiation filtered through the source bushing.

The environmentally friendly iTS Green X-Ray Shield™ material 39 matches the specific gravity of lead and includes a flexible version for specialized applications and an elastomeric grade with high elongation that will deliver exceptional design flexibility.

Tantalum or tungsten material may be used for the shield 39 and each material offers the potential to replace lead shielding material for similar cost and performance advantages.

Referring to FIGS. 3 and 5, the source flange 27 also mounts a cylindrical sleeve 42, as is known, through which the dopant gas may be withdrawn under vacuum. As illustrated, the sleeve 42 has a plurality of circumferentially spaced apertures 43 near one end through which the dopant gas can be drawn into the sleeve 42. A suitable cover (not shown) is provided to close the end of the sleeve 42.

The source liner 30 also mounts a cylindrical sleeve 44, as is known, that is concentrically disposed to overlap the sleeve 42 of the source flange 27. As indicated, the sleeve 44 on the source liner 30 has two enlarged circumferentially spaced openings 45 as well as a cover 46 with a central opening for the passage of the dopant gas.

The invention thus provides an improved source bushing for an ion implanter that improves ion implanter lifetime and reduces ion implanter downtime.

The invention also allows an ion source to be operated in a production facility for extended periods of time.

The improved source bushing may be used with H2, BF3, GeF4, PH3, and AsH3 dopant gases but also any gas that can cause a metallic deposition on the source bushing.

What is claimed is:

1. A source bushing assembly for an ion source comprising
a source bushing of annular shape having an internal vacuum side and an external atmosphere side for passage of a dopant gas therethrough;
a source flange of annular shape secured to said source bushing at one end thereof;
a first shield of annular shape mounted on said source flange and projecting into said source bushing, said first shield being disposed in spaced concentric relation to said internal vacuum side of said source bushing and positioned for adherence of impurities sputtered from the ion source thereon and to slow formation of an electrically conductive coating of impurities sputtered from the ion source on said source bushing;
a source liner of annular shape secured to said source bushing at an opposite end from said source flange; and
a second shield of annular shape mounted on said source liner and projecting into said source bushing, said second shield being disposed in spaced concentric relation to said internal vacuum side of said source bushing and positioned for adherence of impurities sputtered from the ion source thereon and to prevent coating of impurities sputtered from the ion source on said source bushing.

2. A source bushing assembly as set forth in claim 1 wherein said second shield is longitudinally spaced from said first shield.

3. A source bushing assembly as set forth in claim 1 wherein said source bushing includes an internally disposed concentric X-ray shield.

4. A source bushing assembly as set forth in claim 1 further comprising a plurality of guide pins disposed in and between said source bushing and said source flange for aligning said source bushing and said source flange relative to each other during assembly.

5. A source bushing assembly as set forth in claim 1 wherein said source bushing has a plurality of radially disposed internal ribs.

6. A source bushing assembly as set forth in claim 1 wherein said source bushing and said source flange define a circumferential gap therebetween.

7. A source bushing assembly as set forth in claim 1 wherein said source bushing is made of an epoxy resin mixed with one of lead oxide and barium bismuth.

8. An ion implanting apparatus comprising an ion source operable at a first electrical potential; a second component operable at a second electrical potential; and a source bushing assembly coupling said ion source and said second component, said source bushing assembly having
a source bushing of annular shape having an internal vacuum side and an external atmosphere side for passage of a dopant gas therethrough; a source flange of annular shape secured to said source bushing at one end thereof; a first shield of annular shape mounted on said source flange and projecting into said source bushing, said first shield being disposed in spaced concentric relation to said internal vacuum side of said source bushing and positioned for adherence of impurities sputtered from the ion source thereon and to slow formation of an electrically conductive coating of impurities sputtered from the ion source on said source bushing; a source liner of annular shape secured to said source bushing at an opposite end from said source flange; and a second shield of annular shape mounted on said source liner and projecting into said source bushing, said second shield being disposed in spaced concentric relation to said internal vacuum side of said source bushing and positioned for adherence of impurities sputtered from the ion source thereon and to prevent coating of impurities sputtered from the ion source on said source bushing.

9. An ion implanting apparatus as set forth in claim 7 further comprising a channel within said source bushing for a flow of coolant therethrough.

10. A source bushing assembly as set forth in claim 1 further comprising a cylindrical sleeve concentrically within said source bushing, said first shield and said second shield, said cylindrical sleeve having a plurality of circumferentially spaced apertures near one end for passage of the dopant gas into said shield.

* * * * *